(12) United States Patent
Chen et al.

(10) Patent No.: US 11,508,696 B2
(45) Date of Patent: Nov. 22, 2022

(54) SEMICONDUCTOR DEVICE

(71) Applicant: TAIWAN SEMICONDUCTOR MANUFACTURING COMPANY LTD., Hsinchu (TW)

(72) Inventors: Weiming Chris Chen, Taipei (TW); Tu-Hao Yu, Hsin-Chu (TW); Kuo-Chiang Ting, Hsinchu (TW); Shang-Yun Hou, Hsinchu (TW); Chi-Hsi Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 19 days.

(21) Appl. No.: 16/716,225

(22) Filed: Dec. 16, 2019

(65) Prior Publication Data

US 2020/0118979 A1   Apr. 16, 2020

Related U.S. Application Data

(62) Division of application No. 15/725,240, filed on Oct. 4, 2017, now Pat. No. 10,510,722.

(Continued)

(51) Int. Cl.
*H01L 25/065* (2006.01)
*H01L 23/00* (2006.01)
(Continued)

(52) U.S. Cl.
CPC .... *H01L 25/0657* (2013.01); *H01L 23/49833* (2013.01); *H01L 23/50* (2013.01);
(Continued)

(58) Field of Classification Search
CPC ............ H01L 25/0657; H01L 23/5386; H01L 2225/06513
See application file for complete search history.

(56) References Cited

U.S. PATENT DOCUMENTS 6,653,563 B2* 11/2003 Bohr .................. H01L 23/50
174/520
7,057,292 B1* 6/2006 Elenius ............. H01L 21/4853
257/690

(Continued)

*Primary Examiner* — David A Zarneke
(74) *Attorney, Agent, or Firm* — WPAT Law; Anthony King

(57) ABSTRACT

A semiconductor device includes a first electronic component, a second electronic component, a third electronic component, a plurality of first interconnection structures, and a plurality of second interconnection structures. The second electronic component is between the first electronic component and the third electronic component. The first interconnection structures are between and electrically connected to the first electronic component and the second electronic component. Each of the first interconnection structures has a length along a first direction substantially parallel to a surface of the first electronic component and a width along a second direction substantially parallel to the surface and substantially perpendicular to the first direction. The length is larger than the width. The second interconnection structures are between and electrically connected to the second electronic component and the third electronic component.

20 Claims, 18 Drawing Sheets

Related U.S. Application Data

(60) Provisional application No. 62/522,474, filed on Jun. 20, 2017.

(51) Int. Cl.
| | |
|---|---|
| *H01L 23/50* | (2006.01) |
| *H01L 23/498* | (2006.01) |
| *H01L 25/00* | (2006.01) |
| *H01L 23/538* | (2006.01) |
| *H01L 25/16* | (2006.01) |
| *H01L 49/02* | (2006.01) |
| *H01L 23/13* | (2006.01) |

(52) U.S. Cl.
CPC .......... *H01L 23/5386* (2013.01); *H01L 24/03* (2013.01); *H01L 25/16* (2013.01); *H01L 25/50* (2013.01); *H01L 23/13* (2013.01); *H01L 28/90* (2013.01); *H01L 2224/16145* (2013.01); *H01L 2224/16225* (2013.01); *H01L 2224/16227* (2013.01); *H01L 2224/32225* (2013.01); *H01L 2224/73204* (2013.01); *H01L 2225/06513* (2013.01); *H01L 2225/06517* (2013.01); *H01L 2225/06568* (2013.01); *H01L 2225/06572* (2013.01); *H01L 2924/14* (2013.01); *H01L 2924/15159* (2013.01); *H01L 2924/15321* (2013.01); *H01L 2924/181* (2013.01); *H01L 2924/18161* (2013.01); *H01L 2924/19011* (2013.01); *H01L 2924/19104* (2013.01)

(56) References Cited

U.S. PATENT DOCUMENTS

| | | | | |
|---|---|---|---|---|
| 8,148,806 | B2* | 4/2012 | Lin | H05K 1/0231 |
| | | | | 257/686 |
| 8,519,470 | B2* | 8/2013 | Kang | H01L 24/11 |
| | | | | 257/320 |
| 8,853,853 | B2* | 10/2014 | Chang | H01L 24/16 |
| | | | | 257/737 |
| 9,006,081 | B2* | 4/2015 | Ahn | H01L 25/0657 |
| | | | | 438/455 |
| 9,129,955 | B2* | 9/2015 | Castro | H01L 24/16 |
| 9,219,042 | B2* | 12/2015 | Paek | H01L 23/3114 |
| 10,134,698 | B2* | 11/2018 | Chen | H01L 24/05 |
| 2008/0088016 | A1* | 4/2008 | Ho | H01L 24/10 |
| | | | | 257/737 |

* cited by examiner

SEMICONDUCTOR DEVICE

PRIORITY CLAIM AND CROSS-REFERENCE

This patent is a divisional application of U.S. patent application Ser. No. 15/725,240 filed on Oct. 4, 2017, entitled of "SEMICONDUCTOR DEVICE AND METHOD FOR MANUFACTURING THE SAME", which claims priority of U.S. provisional application Ser. No. 62/522,474 filed on 20 Jun. 2017, which is incorporated by reference in its entirety.

BACKGROUND

Integrated passive devices (IPDs) are passive devices such as capacitors and inductors that are fabricated in the form of integrated circuit. Recently, the IPDs are employed in SOCs, and built in the package structure. Problems with the integration of IPDs may include, for example, the electrical resistance of the interconnection structures between the IPDs and the active devices being too high, and thus adversely influencing electrical performance of the package structure.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
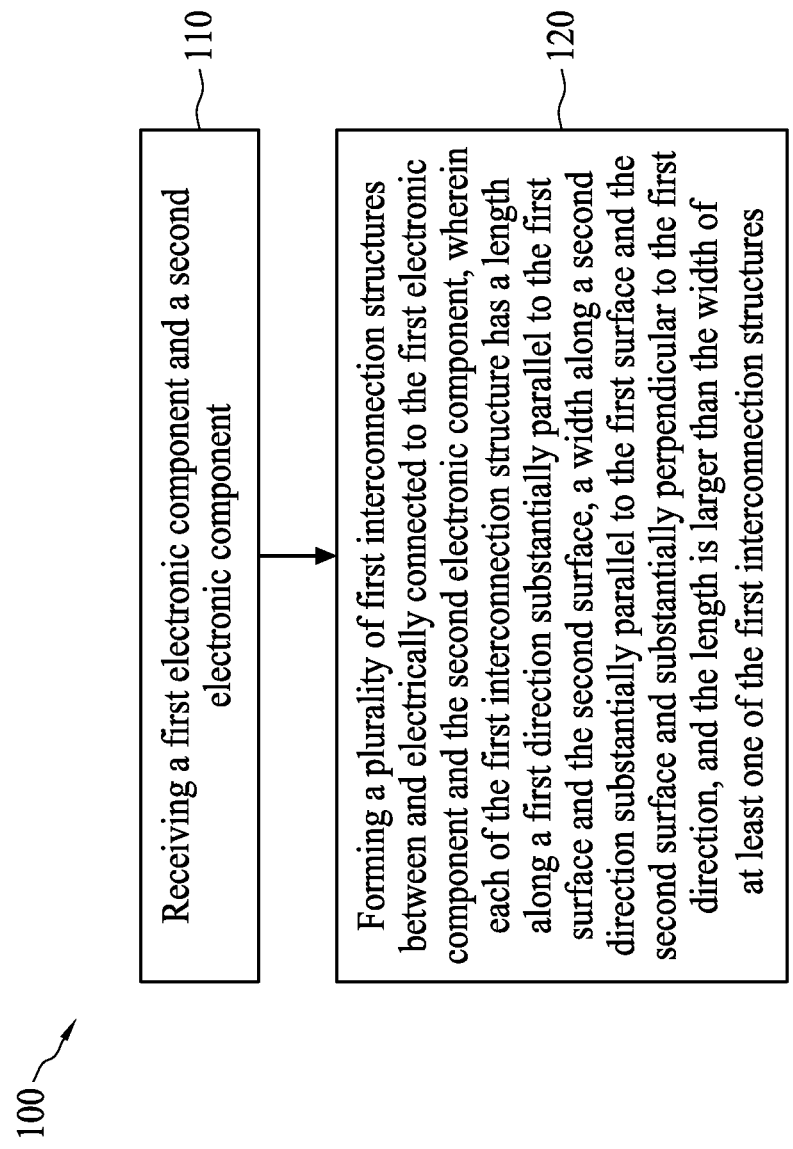
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices.

The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In one or more embodiments of the present disclosure, a semiconductor device including a bar-shaped interconnection is provided. The bar-shaped interconnection has a length lager than a width. The bar-shaped interconnection is configured to electrically connect two or more electronic components. Each of the bar-shaped interconnection is electrically connected to plural of electrical terminals, and has reduced resistance due to its increased area. Thus, the bar-shaped interconnections help to improve electrical performance of the semiconductor device. In some embodiments of the present disclosure, the interconnection structures covers plural of electrical terminals, which helps to increase the alignment tolerance between the electronic components, and thus the reliability can be increased.

FIG. 1 is a flow chart illustrating a method for manufacturing a semiconductor device according to various aspects of one or more embodiments of the present disclosure. The method 100 begins with operation 110 in which a first electronic component and a second electronic component are received. The method proceeds with operation 120 in which a plurality of first interconnection structures are formed between and electrically connected to the first electronic component and the second electronic component. Each of the first interconnection structures has a length along a first direction substantially parallel to the first surface and the second surface, a width along a second direction substantially parallel to the first surface and the second surface and substantially perpendicular to the first direction, and the length is larger than the width of at least one of the interconnection structures.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
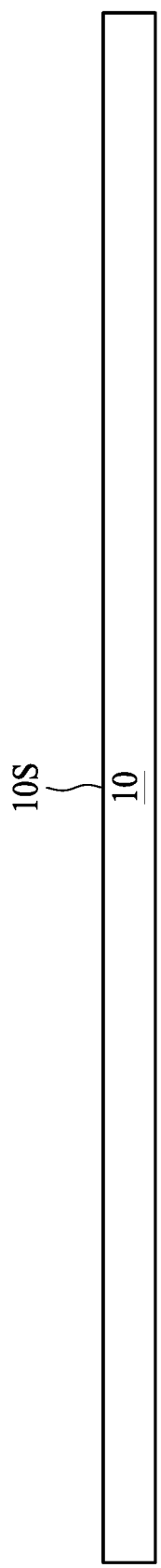
FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure.
Figure 2B:
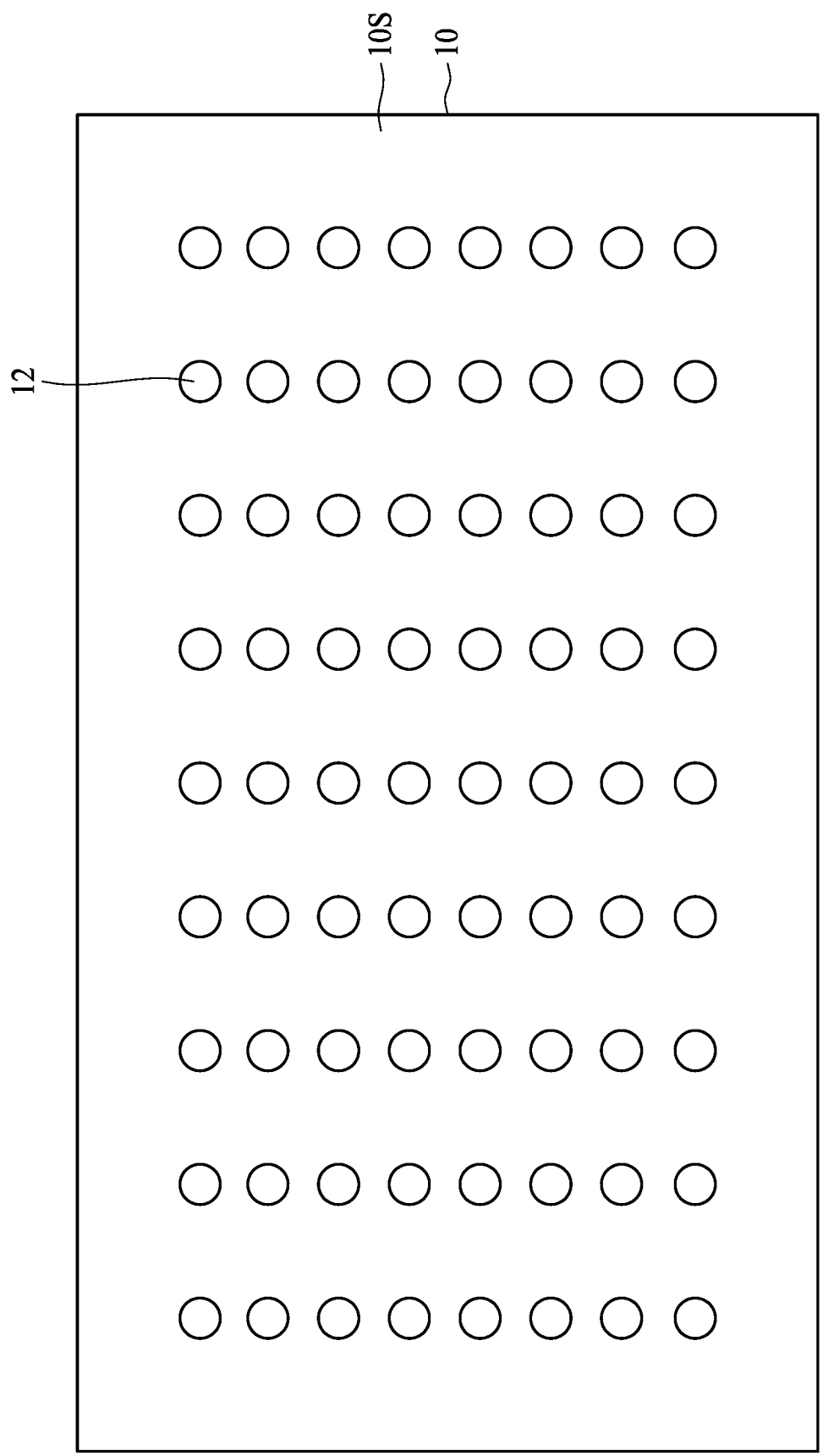
Figure 2C:
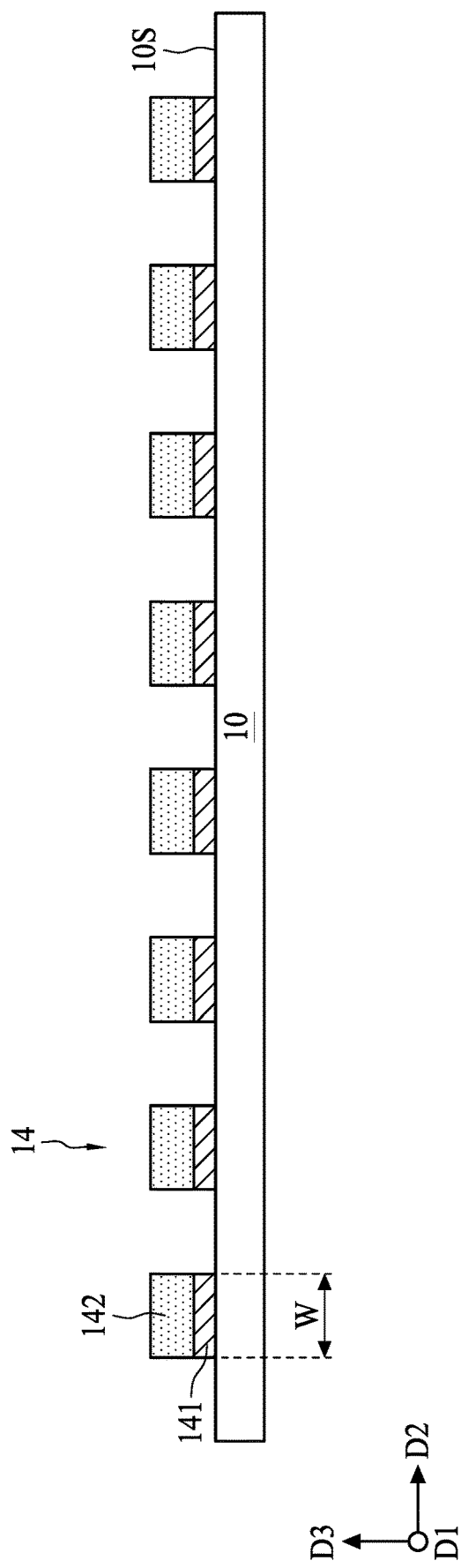
Figure 2D:
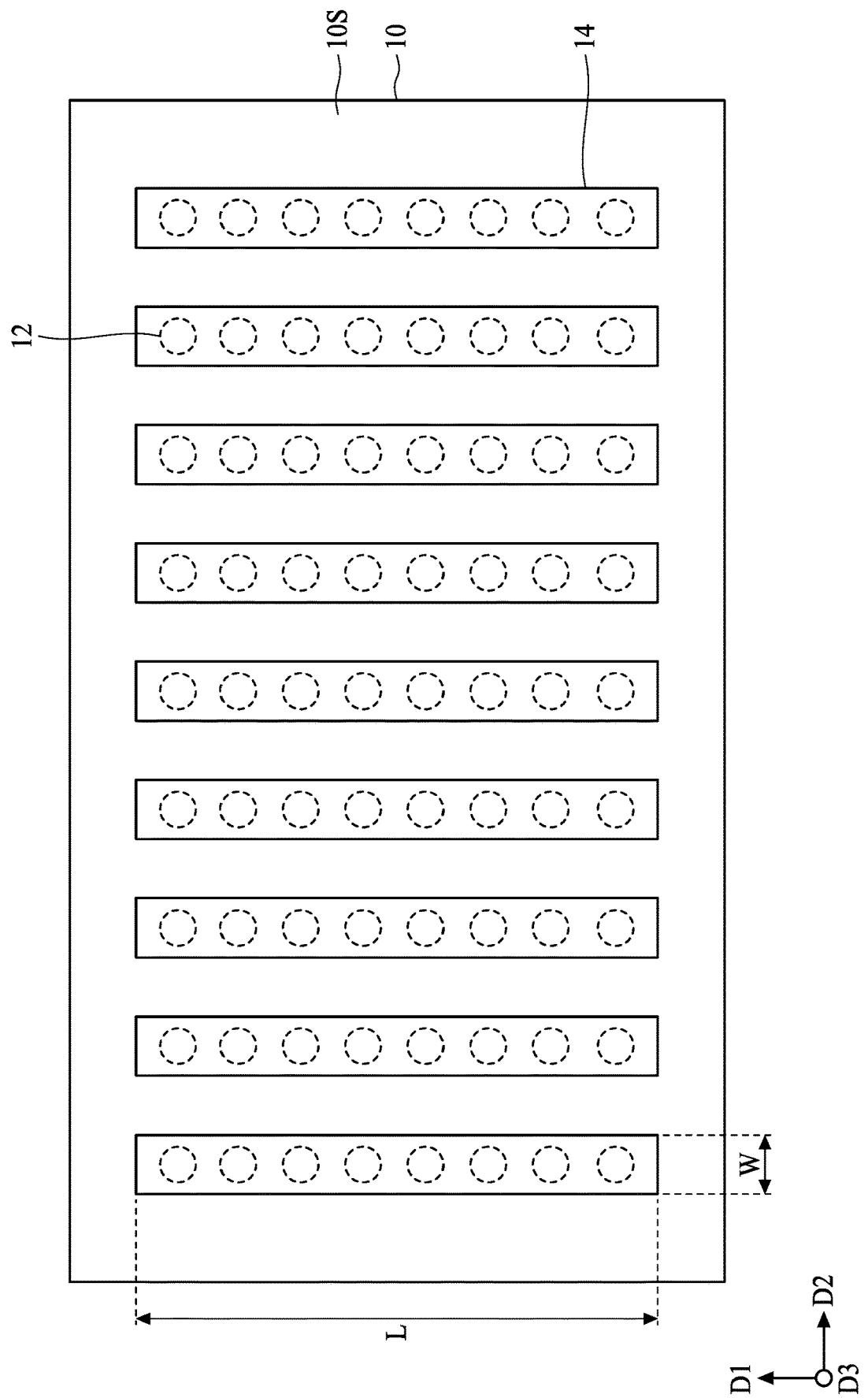
Figure 2E:
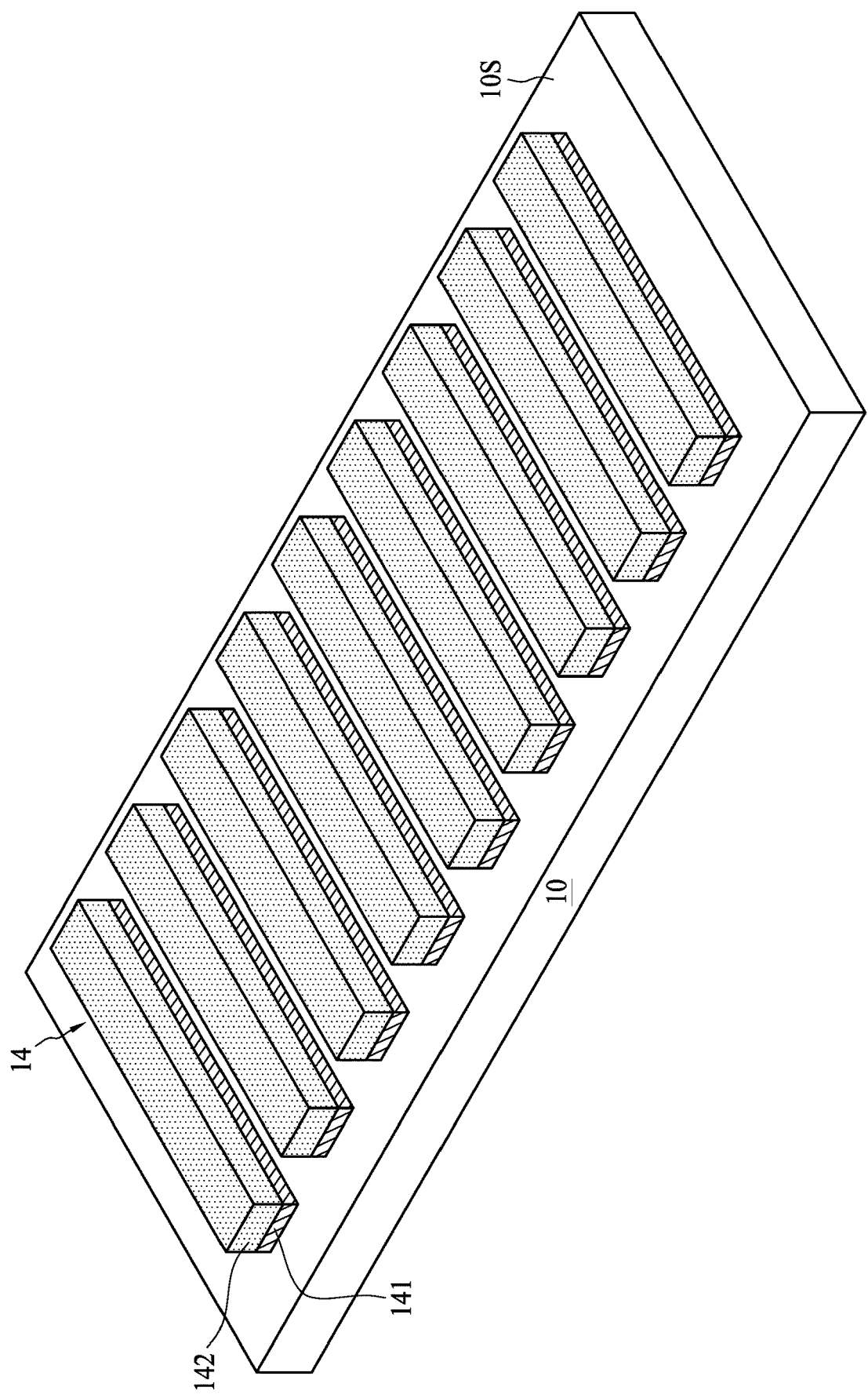
Figure 2F:
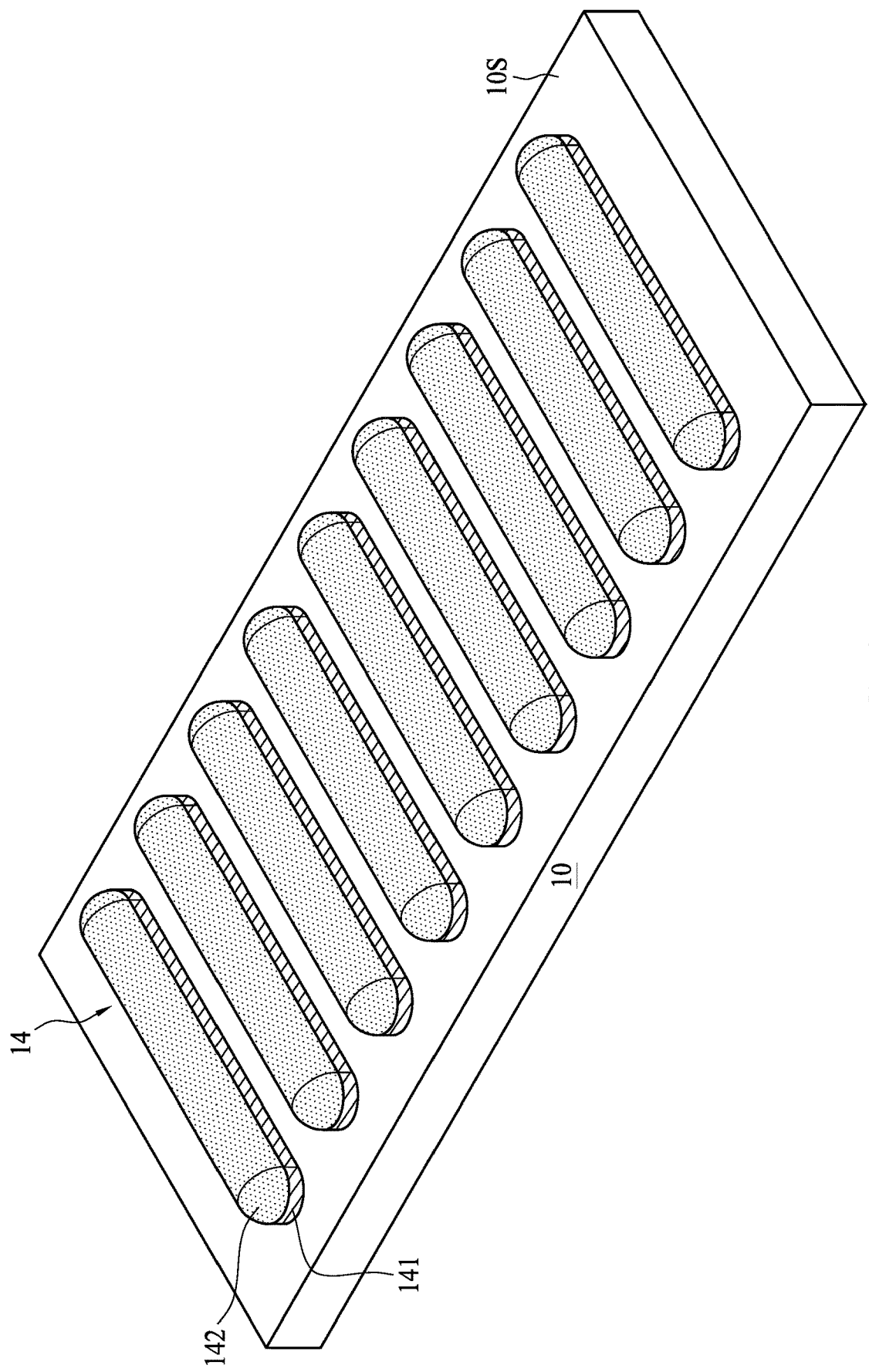
Figure 2G:
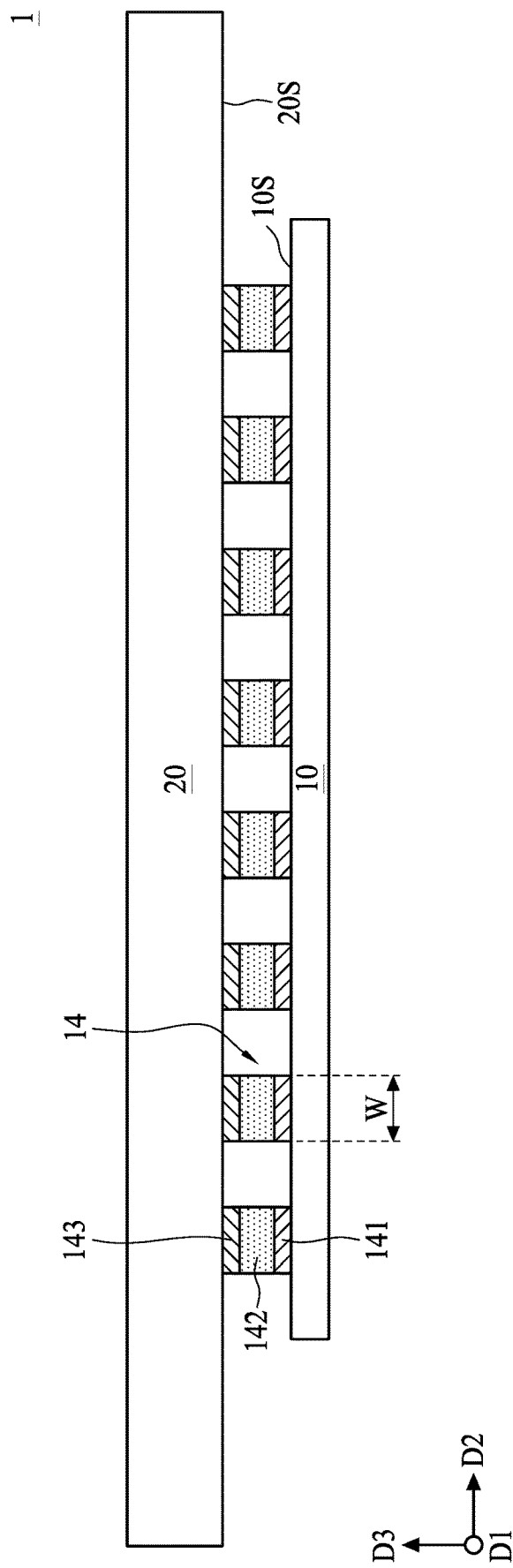

FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure, where FIG. 2A, FIG. 2C and FIG. 2G are cross-sectional views at one of various operations of manufacturing a semiconductor device. FIG. 2B and FIG. 2D are top views at one of various operations of manufacturing a semiconductor device, and FIG. 2E and FIG. 2F are oblique views at one of various operations of manufacturing a semiconductor device. As depicted in FIG. 2A, an electronic component such as a first electronic component 10 is received. The first electronic component 10 includes a surface such as a first surface 10S. In some embodiments, the first electronic component 10 may include an integrated passive device, an active device, an interposer, a package structure, a package substrate, a printed circuit board or the like. In some embodiments, the first electronic component 10 may include one or more integrated passive devices, which are in a form of integrated circuit, such as capacitors, inductors, resistors, or combinations thereof. In some embodiments, the first electronic component 10 may include, but is not limited to, a deep trench capacitor (DTC). As depicted in FIG. 2B, the first electronic component 10 may include electrical terminals 12 electrically connected to the integrated circuit inside the first electronic component 10 and exposed from the first surface 10S. By way of example, the electrical terminals 12 may include, but is not limited to, a bonding pad or the like.

As depicted in FIG. 2C, FIG. 2D and FIG. 2E, a plurality of interconnection structures such as first interconnection structures 14 are formed over the first surface 10S of the first electronic component 10. In some embodiments, each of the first interconnection structures 14 has a length L along a first direction D1 substantially parallel to the first surface 10S, a width W along a second direction D2 substantially parallel to the first surface 10S and substantially perpendicular to the first direction D1, and the length L is larger than the width W of at least one or all of the first interconnection structures 14. In some embodiments, the length L of each of the first interconnection structures 14 is larger than the width W of the respective first interconnection structure 14. In some embodiments, the ratio of the length L to the width W of at least one of the first interconnection structures 14 is greater than or equal to 2, greater than or equal to 5, or greater than or equal to 10. In some embodiments, the ratio of the length L to the width W of each of the first interconnection structures 14 is greater than or equal to 2, greater than or equal to 5, or greater than or equal to 10.

In some exemplary embodiments, the length L of at least one or all of the first interconnection structures 14 is larger than or equal to 100 micrometers such as ranging from about 300 micrometers to about 1 millimeter, but is not limited thereto. In some exemplary embodiments, the width W of the first interconnection structure 14 is smaller than or equal to 50 micrometers, but is not limited thereto. In some embodiments, the first interconnection structure 14 covers more than one of the electrical terminals 12 of the first electronic component 10 such that the first interconnection structure 14 is electrically connected to more than one of the electrical terminals 12 of the first electronic component 10. In some embodiments, each of the first interconnection structures 14 is electrically connected to the electrical terminals 12 arranged in a single column. In some embodiments, the first interconnection structures 14 are arranged in the second direction D2, and each of the first interconnection structures 14 are extended along the first direction D1.

In some embodiments, the first interconnection structure 14 includes more than one conductive layers stacked to one another. In some embodiments, the first interconnection structure 14 includes a first conductive layer 141 and a second conductive layer 142 stacked on the first conductive layer 141. In some embodiments, the first conductive layer 141 may include, but is not limited to, an under bump metallurgy (UBM) or the like electrically connected to the electrical terminals 12 of the first electronic component 10. In some embodiments, the second conductive layer 142 may include, but is not limited to, a conductive bump, a conductive ball, a conductive paste or the like electrically connected to the first conductive layer 141. In some embodiments, the length and width of the first conductive layer 141 and the second conductive layer 142 may be substantially the same, which may be substantially equal to the length L and the width W of the first interconnection structure 14. In some embodiments, the thickness of the second conductive layer 142 is thicker than that of the first conductive layer 141. In some embodiments, the ratio of the thickness of the second conductive layer 142 to the thickness of the first conductive layer 141 is larger than or equal to 2, but is not limited thereto. By way of examples, the thickness of the second conductive layer 142 is ranging from about 15 micrometers to about 50 micrometers such as about 25 micrometers, but not limited thereto. By way of examples, the thickness of the first conductive layer 141 is ranging from about 5 micrometers to about 15 micrometers such as 10 micrometers, but not limited thereto. As depicted in FIG. 2F, a reflow operation may be carried out on the second conductive layer 142.

As depicted in FIG. 2G, another electronic component such as a second electronic component 20 is received. The second electronic component 20 includes a surface such as a second surface 20S. In some embodiments, the second electronic component 20 may include an integrated passive device, an active device, an interposer, a package structure, a package substrate, a printed circuit board or the like. In some embodiments, the second electronic component 20 may include an active device such as a logic device or the like. In some embodiments, the second electronic component 20 includes third conductive layers 143 formed over the second surface 20S. In some embodiments, the length and the width of the third conductive layer 143 are substantially equal to that of the first conductive layer 141 and the second conductive layer 142. In some embodiments, the third conductive layer 143 may include, but is not limited to, an under bump metallurgy (UBM) or the like electrically connected to the second electronic component 20. In some embodiments, the thickness of the third conductive layer 143 is ranging from about 3 micrometers to about 10 micrometers such as about 5 micrometers, but is not limited thereto. The second electronic component 20 and the first electronic component 10 are oriented with the second surface 20S facing the first surface 10S. The third conductive layers 143 are then coupled to respective second conductive layers 142 and first conductive layers 141 to form a plurality of first interconnection structures 14 stacked by the first conductive layer 141, the second conductive layer 142 and the third conductive layer 143. Accordingly, the second electronic component 20 and the first electronic component 10 are electrically connected through the first interconnection structures 14, forming a semiconductor device 1.

In some embodiments of the present disclosure, the first interconnection structures 14 are bar-shaped interconnections, and each of which electrically connected to plural of electrical terminals 12. The bar-shaped interconnection has increased cross-sectional area perpendicular to the direction of current flow between the first electronic component 10 and the second electronic component 20, i.e. the third direction D3, and thus the resistance of the interconnection between the first electronic component 10 and the second electronic component 20 is reduced. Thus, the bar-shaped interconnections help to improve electrical performance of the semiconductor device 1. In some embodiments of the present disclosure, the first interconnection structures 14 covers plural of electrical terminals 12, and thus help to increase the alignment tolerance between the first electronic component 10 and the second electronic component 20.

Figure 3:
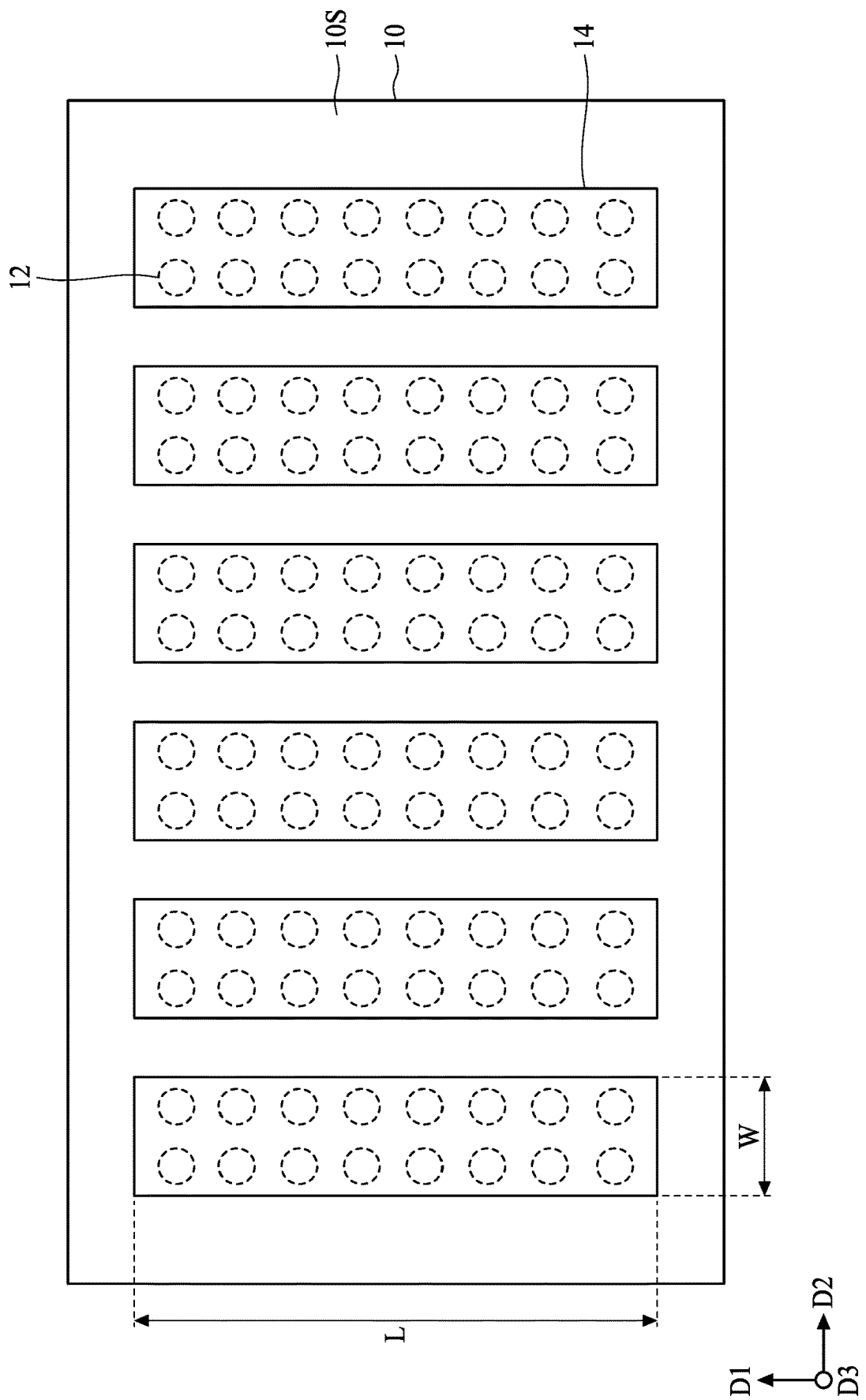
FIG. 3 is a schematic view at one of various operations of manufacturing a semiconductor device according to one or more embodiments of the present disclosure.

FIG. 3 is a schematic view at one of various operations of manufacturing a semiconductor device according to one or more embodiments of the present disclosure. In contrast to FIG. 2D, each of the first interconnection structures 14 is electrically connected to the electrical terminals 12 arranged in an array of a plurality of columns and rows as depicted in FIG. 3. In some embodiments, the first interconnection structures 14 covers more electrical terminals 12, and thus help to increase the alignment tolerance between the first electronic component 10 and the second electronic component 20.

Figure 4:
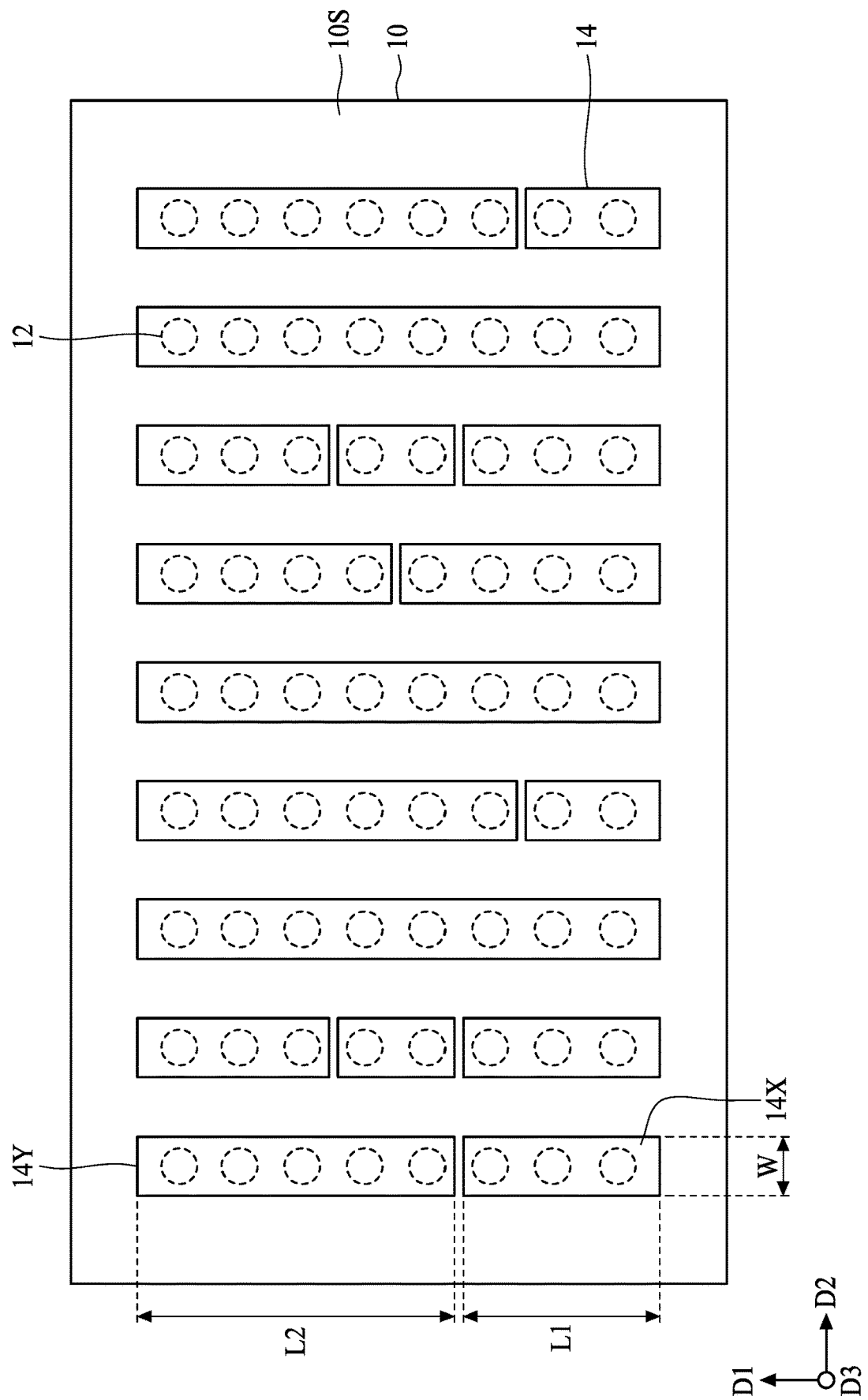
FIG. 4 is a schematic view at one of various operations of manufacturing a semiconductor device according to one or more embodiments of the present disclosure.

FIG. 4 is a schematic view at one of various operations of manufacturing a semiconductor device according to one or more embodiments of the present disclosure. In contrast to FIG. 2D, at least one of the first interconnection structures 14 may include segmented interconnection structures such as a first segmented interconnection structure 14X, and a second segmented interconnection structure 14Y. In some embodiments, the first segmented interconnection structure 14X has a length L1 along the first direction D1, and the second segmented interconnection structure 14Y has a length L2 along the first direction D1. In some embodiments, the length L1 may be different from the length L2. In some embodiments, the first segmented interconnection structure 14X and the second segmented interconnection structure 14Y may be electrically disconnected from each other.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 5:
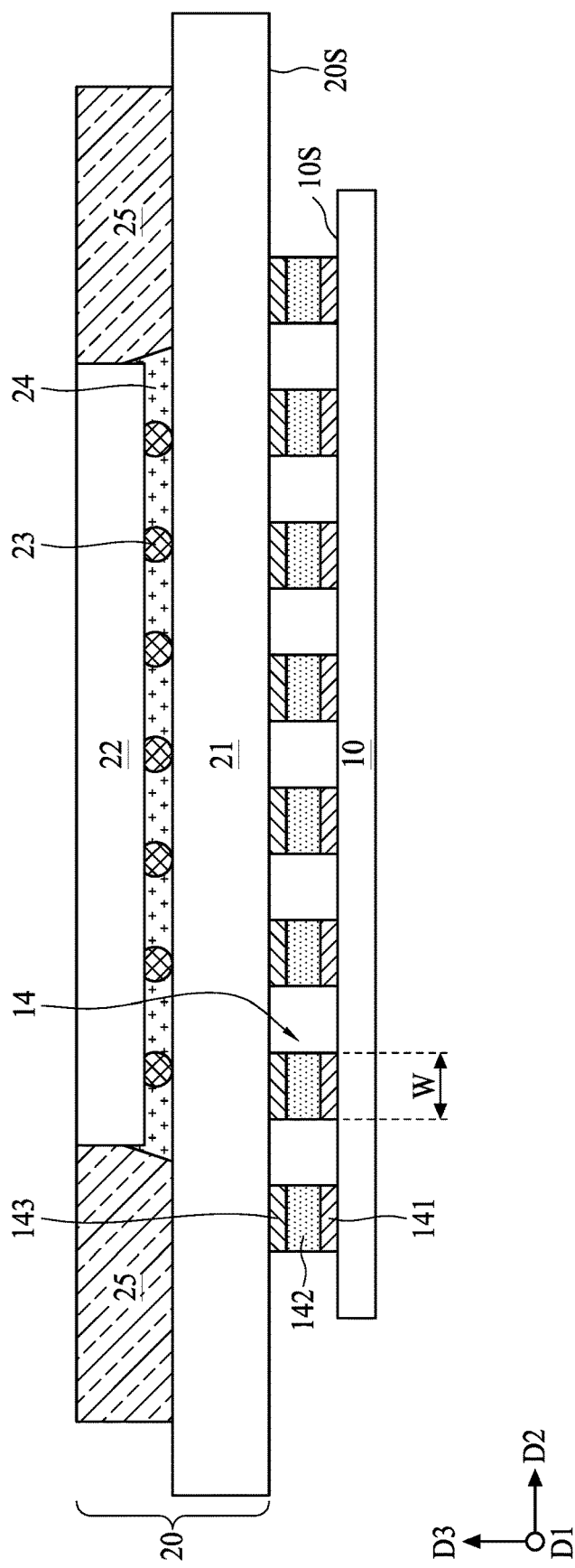
FIG. 5 is a schematic view of a semiconductor device according to some embodiments of the present disclosure.

FIG. 5 is a schematic view of a semiconductor device according to some embodiments of the present disclosure. As depicted in FIG. 5, in contrast to the semiconductor device 1 of FIG. 2G, the semiconductor device 2 may include a chip on wafer on substrate (CoWoS) package structure, and the second electronic component 20 of the semiconductor device 2 may include a chip on wafer (CoW) die. In some embodiments, the second electronic component 20 includes an interposer 21, one or more semiconductor dies 22, conductors 23, an underfill layer 24 and an encapsulant 25. In some embodiments, the interposer 21 may include through vias such as through substrate vias (TSVs) or the like electrically connected to the conductors 23 disposed over the interposer 21 and the first interconnection structures 14 under the interposer 21. In some embodiments, the semiconductor die 22 is disposed over the interposer 21, and electrically connected to the interposer 21 through the conductors 23. In some embodiments, the conductors 23 may include, but are not limited to be, conductive bumps, conductive pastes, conductive balls or the like. In some embodiments, the underfill layer 24 is disposed between the semiconductor die 22 and the interposer 21 and encloses the conductors 23. In some embodiments, the encapsulant 25 such as a molding compound may encapsulate at least a portion of the semiconductor die 22.

The features of the first interconnection structure 14 of the semiconductor device 2 may be similar to that of the semiconductor device 1, and are shown in FIG. 2D, FIG. 2E and FIG. 2F in some exemplary examples, or shown in FIG. 3 and FIG. 4 in some alternative exemplary examples. In some embodiments, the length L of at least one of the first interconnection structures 14 is larger than the width W of the respective first interconnection structure 14. In some embodiments, the ratio of the length L to the width W of at least one of the first interconnection structures 14 is greater than or equal to 2, greater than or equal to 5, or greater than or equal to 10. In some exemplary embodiments, the length L of the first interconnection structure 14 is larger than or equal to 100 micrometers such as ranging from about 300 micrometers to about 1 millimeter, but is not limited thereto.

In some exemplary embodiments, the width W of the first interconnection structure 14 is smaller than or equal to 50 micrometers, but is not limited thereto. In some embodiments, the first interconnection structure 14 covers more than one of the electrical terminals 12 of the first electronic component 10 such that the first interconnection structure 14 is electrically connected to more than one of the electrical terminals 12 of the first electronic component 10. In some embodiments, each of the first interconnection structures 14 is electrically connected to the electrical terminals 12 arranged in a single column as shown in FIG. 2D. In some embodiments, each of the first interconnection structures 14 is electrically connected to the electrical terminals 12 arranged in an array of a plurality of columns and rows as depicted in FIG. 3. In some embodiments, at least one of the first interconnection structures 14 may include segmented interconnection structures as depicted in FIG. 4.

Figure 6A:
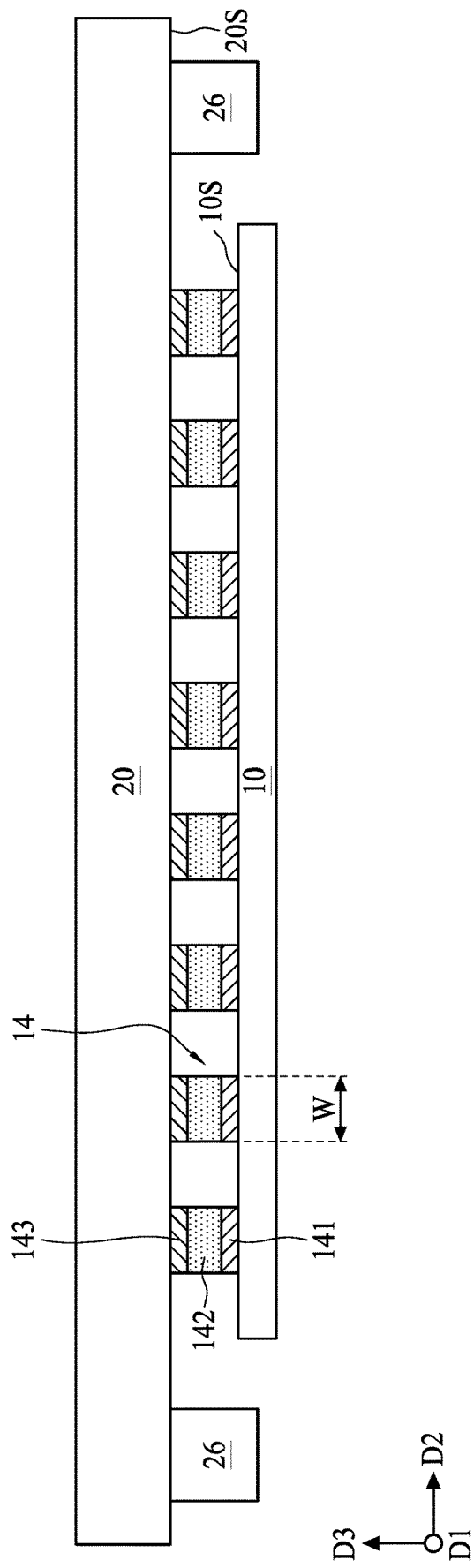
FIG. 6A, FIG. 6B and FIG. 6C are schematic views at one of various operations of manufacturing a semiconductor device according to one or more embodiments of the present disclosure.
Figure 6B:
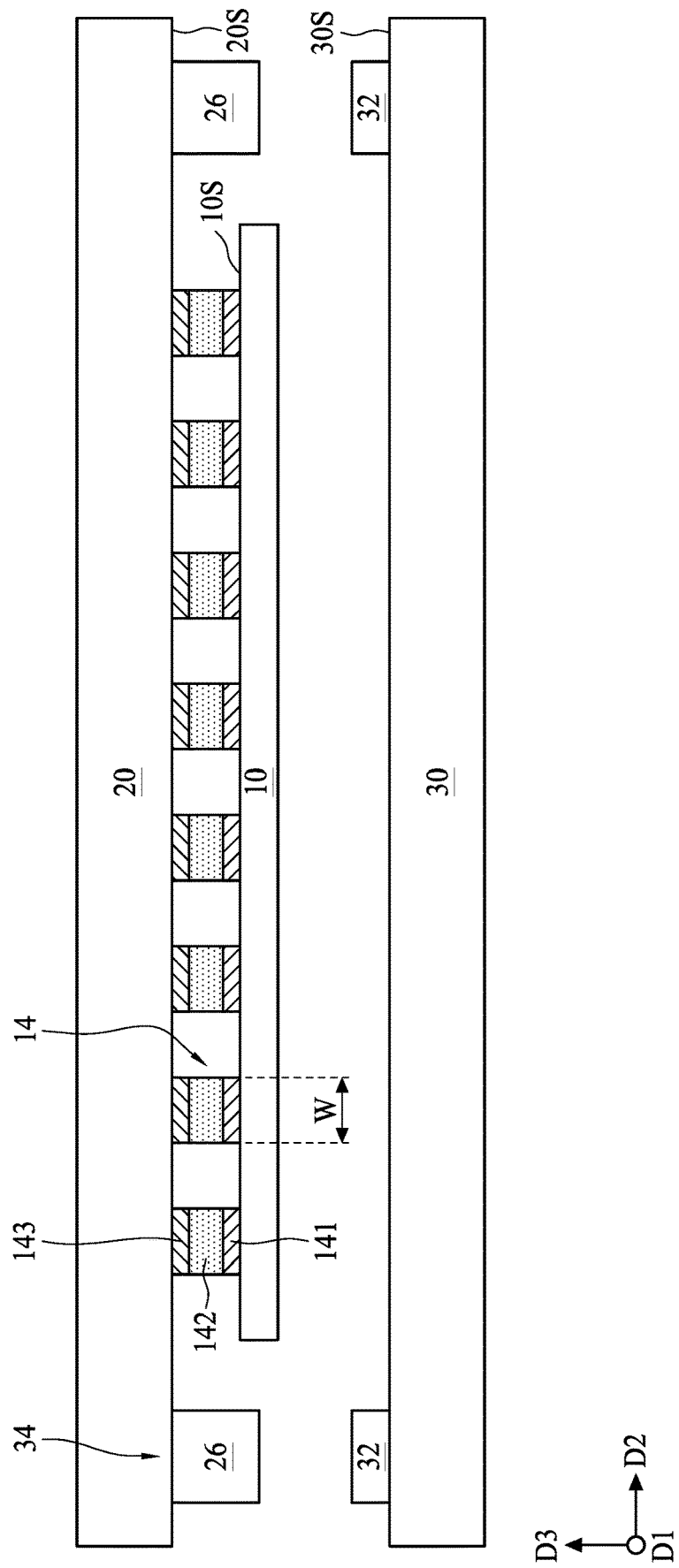
Figure 6C:
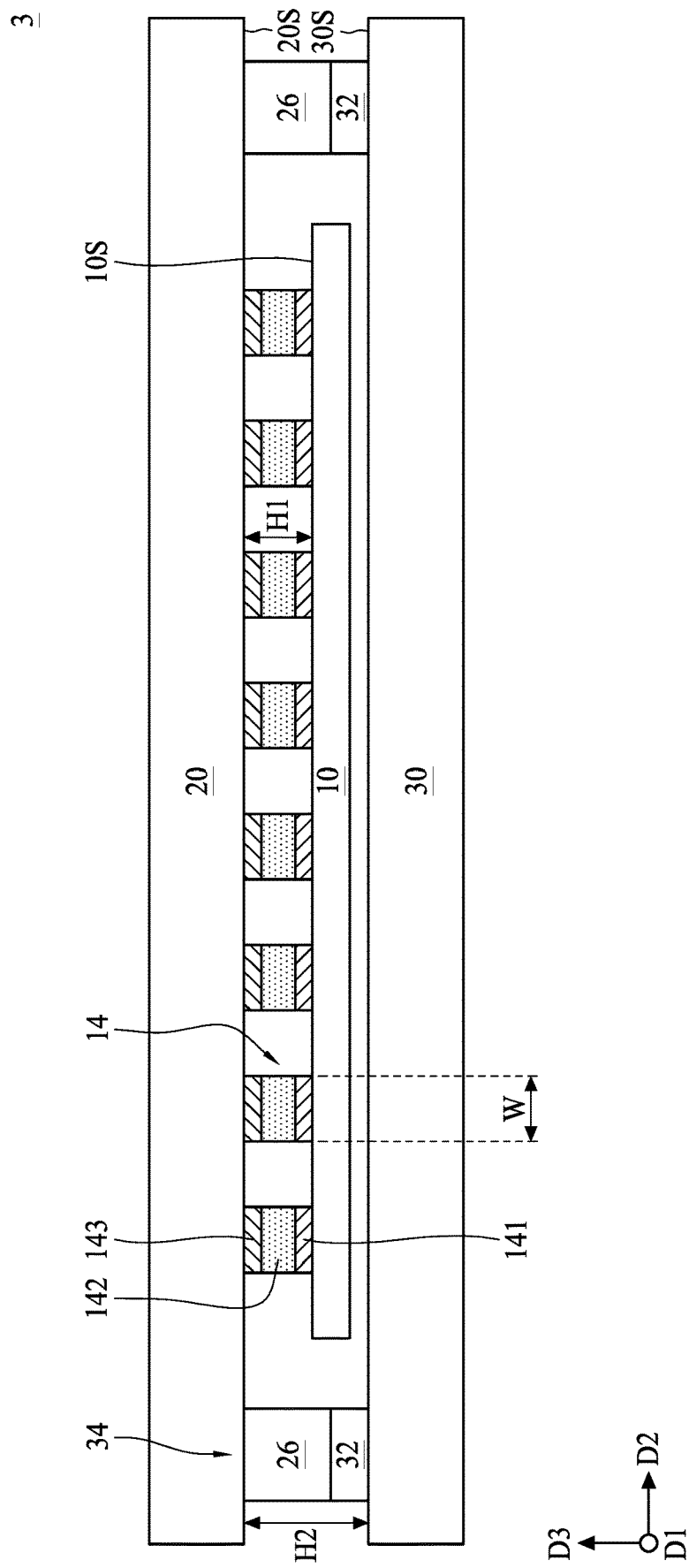

FIG. 6A, FIG. 6B and FIG. 6C are schematic views at one of various operations of manufacturing a semiconductor device according to one or more embodiments of the present disclosure. In some embodiments, the manufacturing of a semiconductor device of FIG. 6A, FIG. 6B and FIG. 6C may be implemented followed by FIG. 2G. As depicted in FIG. 6A, a plurality of first conductive structures 26 may be formed over the surface 20S of the second electronic component 20. In some embodiments, the first conductive structures 26 may be formed before the second electronic component 20 and the first electronic component 10 are connected. In some embodiments, the first conductive structure 26 may include, but is not limited to, a bonding pad, a UBM, a conductive bump, a conductive ball, a conductive paste, the like or combinations thereof electrically connected to the second electronic component 20.

As depicted in FIG. 6B, a third electronic component 30 is received. The third electronic component 30 includes a surface such as a third surface 30S. In some embodiments, the third electronic component 30 may include an integrated passive device, an active device, an interposer, a package structure, a package substrate, a printed circuit board or the like. In some embodiments, the third electronic component 30 may include, but is not limited to a package substrate or the like. In some embodiments, the third electronic component 30 may further include a plurality of second conductive structures 32 over the surface 30S. In some embodiments, the second conductive structures 32 may include, but are not limited to a bonding pad, a UBM, a conductive bump, a conductive ball, a conductive paste, the like or combinations thereof electrically connected to the third electronic component 30.

As depicted in FIG. 6C, the second electronic component 20 and the third electronic component 30 are oriented with the second surface 20S facing the third surface 30S. The first conductive structures 26 are then coupled to the respective second conductive structures 32 to form a plurality of second interconnection structures 34, and the second electronic component 20 and the third electronic component 30 are electrically connected through the second interconnection structures 34 to form a semiconductor device 3. In some embodiments, the height H2 of the second interconnection structure 34 is larger than the height H1 of the first interconnection structure 14 such that the first electronic component 10 is apart from the third electronic component 30.

The features of the first interconnection structure 14 of the semiconductor device 3 may be similar to that of the semiconductor device 1, and are shown in FIG. 2D, FIG. 2E and FIG. 2F for example. In some embodiments, the length L of at least one of the first interconnection structures 14 is larger than the width W of the respective first interconnection structure 14. In some embodiments, the ratio of the length L to the width W of at least one of the first interconnection structures 14 is greater than or equal to 2, greater than or equal to 5, or greater than or equal to 10. In some exemplary embodiments, the length L of the first interconnection structure 14 is larger than or equal to 100 micrometers such as ranging from about 300 micrometers to about 1 millimeter, but is not limited thereto. In some exemplary embodiments, the width W of the first interconnection structure 14 is smaller than or equal to 50 micrometers, but is not limited thereto. In some embodiments, the first interconnection structure 14 covers more than one of the electrical terminals 12 of the first electronic component 10 such that the first interconnection structure 14 is electrically connected to more than one of the electrical terminals 12 of the first electronic component 10. In some embodiments, each of the first interconnection structures 14 is electrically connected to the electrical terminals 12 arranged in a single column as shown in FIG. 2D. In some embodiments, each of the first interconnection structures 14 is electrically connected to the electrical terminals 12 arranged in an array of a plurality of columns and rows as depicted in FIG. 3. In some embodiments, at least one of the first interconnection structures 14 may include segmented interconnection structures as depicted in FIG. 4.

Figure 7A:
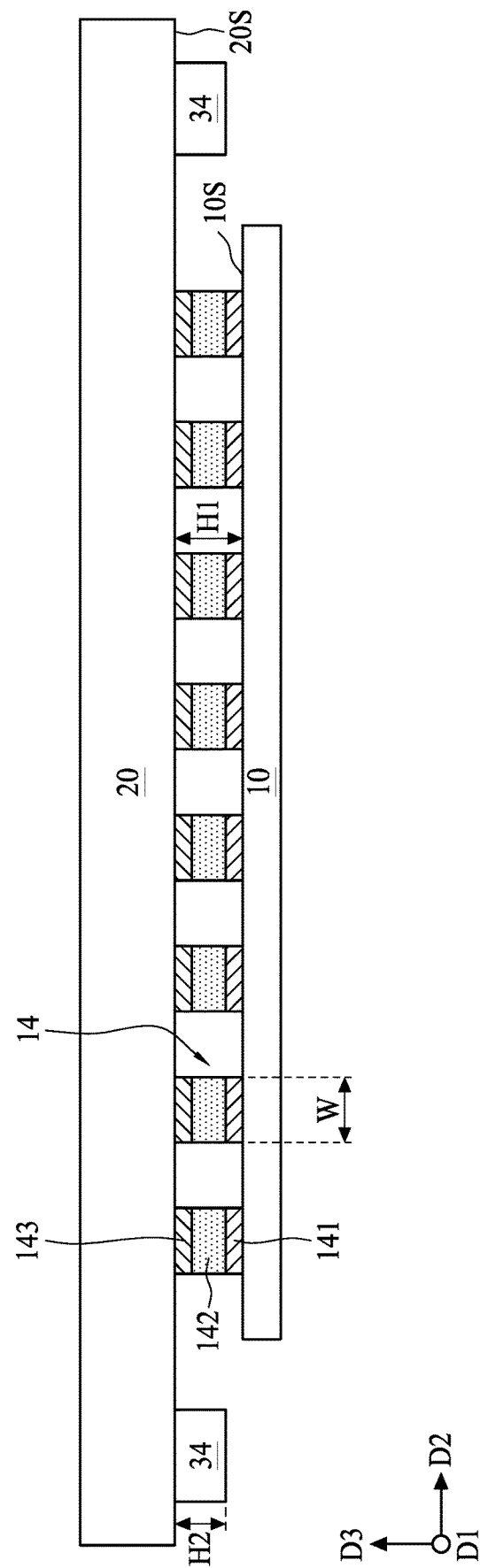
FIG. 7A, FIG. 7B and FIG. 7C are schematic views at one of various operations of manufacturing a semiconductor device according to one or more embodiments of the present disclosure.
Figure 7B:
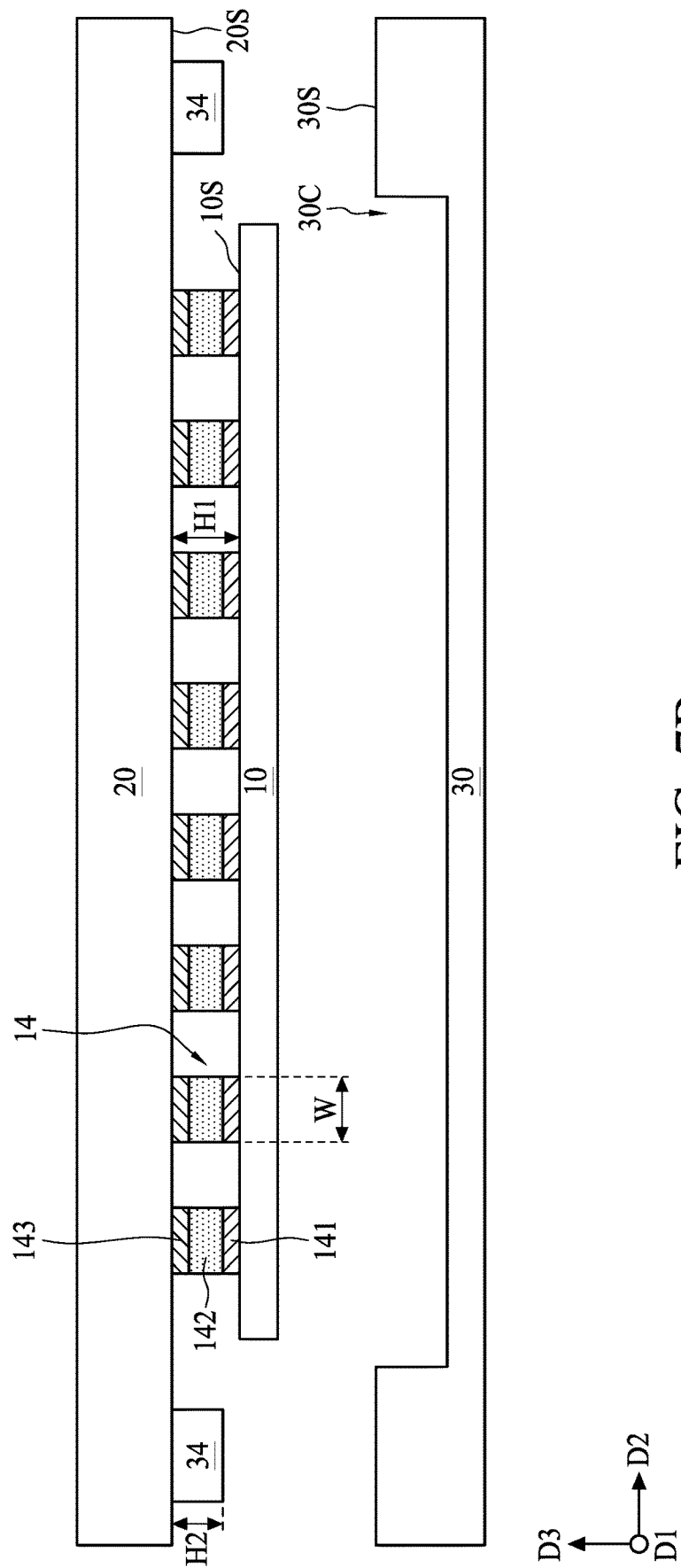
Figure 7C:
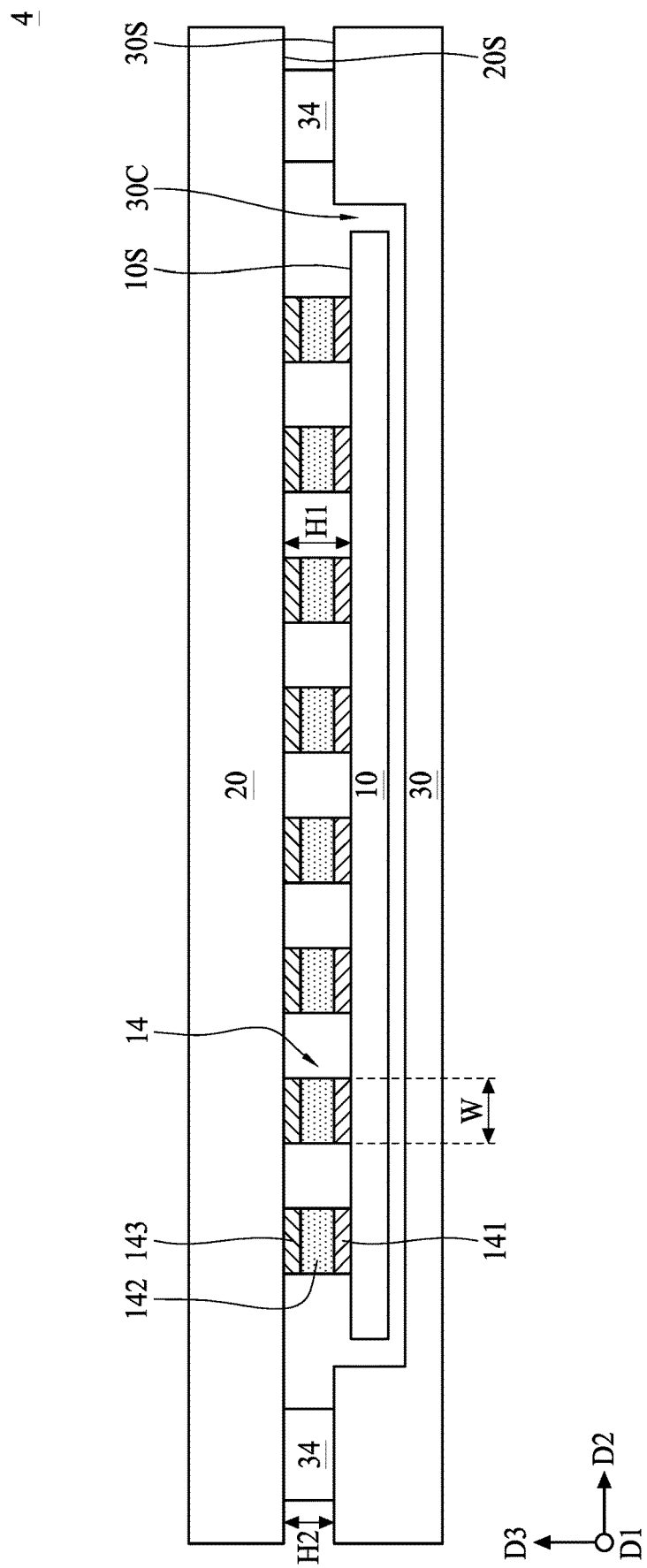

FIG. 7A, FIG. 7B and FIG. 7C are schematic views at one of various operations of manufacturing a semiconductor device according to one or more embodiments of the present disclosure. In some embodiments, the manufacturing of a semiconductor device of FIG. 7A, FIG. 7B and FIG. 7C may be implemented followed by FIG. 2G. As depicted in FIG. 7A, a plurality of second interconnection structures 34 may be formed over the surface 20S of the second electronic component 20. In some embodiments, the second interconnection structures 34 may be formed before the second electronic component 20 and the first electronic component 10 are connected. In some embodiments, second interconnection structure 34 may include, but is not limited to, a bonding pad, a UBM, a conductive bump, a conductive ball, a conductive paste, the like or combinations thereof electrically connected to the second electronic component 20. In some embodiments, the height H2 of the second interconnection structure 34 may be smaller than the height H1 of the first interconnection structure 14.

As depicted in FIG. 7B, a third electronic component 30 is received. The third electronic component 30 includes a surface such as a third surface 30S. In some embodiments, the third electronic component 30 may include, but is not limited to, a package substrate, a printed circuit or the like. In some embodiments, the third electronic component 30 may further include a plurality of conductive structures (not shown) over the surface 30S configured to electrically connect the second interconnection structures 34 of the second electronic component 20. In some embodiments, the third electronic component 30 of the semiconductor device 4 may include a cavity 30C recessed from the third surface 30S and configured to accommodate the first electronic component 10 such that the first electronic component 10 may not be in contact with the third electronic component 30 after the second electronic component 20 and the third electronic component 30 are coupled.

As depicted in FIG. 7C, the second electronic component 20 and the third electronic component 30 are oriented with the second surface 20S facing the third surface 30S. The second interconnection structures 34 are then coupled to and electrically connected to the third electronic component 30 to form a semiconductor device 4.

The features of the first interconnection structure 14 of the semiconductor device 4 may be similar to that of the semiconductor device 1, and are shown in FIG. 2D, FIG. 2E and FIG. 2F for example. In some embodiments, the length L of at least one of the first interconnection structures 14 is larger than the width W of the respective first interconnection structure 14. In some embodiments, the ratio of the length L to the width W of at least one of the first interconnection structures 14 is greater than or equal to 2, greater than or equal to 5, or greater than or equal to 10. In some exemplary embodiments, the length L of the first interconnection structure 14 is larger than or equal to 100 micrometers such as ranging from about 300 micrometers to about 1 millimeter, but is not limited thereto. In some exemplary embodiments, the width W of the first interconnection structure 14 is smaller than or equal to 50 micrometers, but is not limited thereto. In some embodiments, the first interconnection structure 14 covers more than one of the electrical terminals 12 of the first electronic component 10 such that the first interconnection structure 14 is electrically connected to more than one of the electrical terminals 12 of the first electronic component 10. In some embodiments, each of the first interconnection structures 14 is electrically connected to the electrical terminals 12 arranged in a single column as shown in FIG. 2D. In some embodiments, each of the first interconnection structures 14 is electrically connected to the electrical terminals 12 arranged in an array of a plurality of columns and rows as depicted in FIG. 3. In some embodiments, at least one of the first interconnection structures 14 may include segmented interconnection structures as depicted in FIG. 4.

Figure 8:
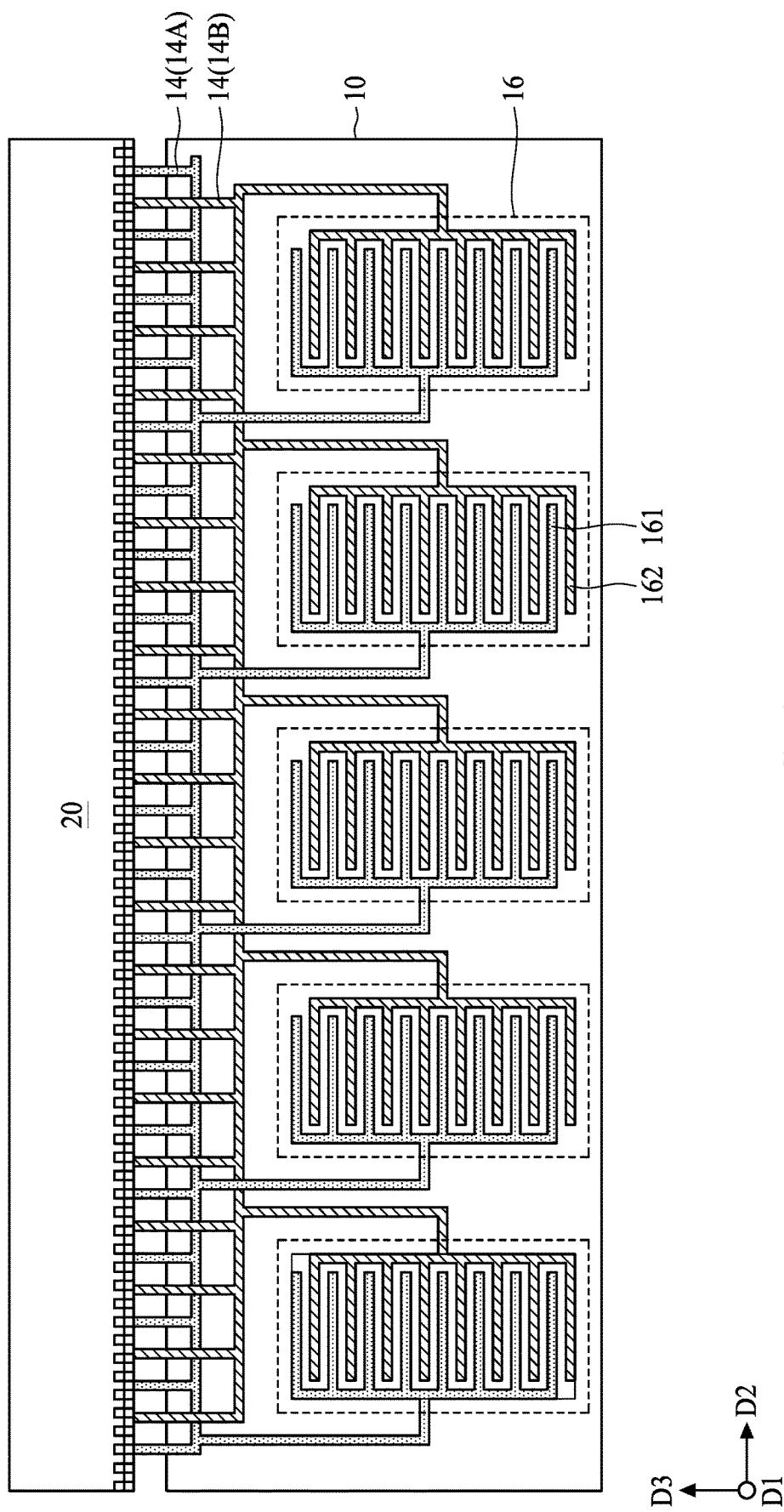
FIG. 8 is a schematic view of a semiconductor device according to one or more embodiments of the present disclosure.

FIG. 8 is a schematic view of a semiconductor device according to one or more embodiments of the present disclosure. As depicted in FIG. 8, the semiconductor device 5 may include a first set 14A and a second set 14B of the first interconnection structures 14. In some embodiments, the first interconnection structures 14 of the first set 14A are electrically connected to each other, and the first interconnection structures 14 of the second set 14B are electrically connected to each other. In some embodiments, the interconnection structures 14 of the first set 14A and the second set 14B are arranged alternately in the second direction D2 but electrically disconnected from one another. In some embodiments, the first electronic component 10 includes a plurality of deep trench capacitors 16, and each of which includes first electrodes 161 and second electrodes 162 overlapping to each other. In some embodiments, the first electrodes 161 of the deep trench capacitors 16 are electrically connected to the second electronic component 20 through the first set 14A of the first interconnection structures 14, while the second electrodes 162 of the deep trench capacitors 16 are electrically connected to the second electronic component 20 through the second set 14B of the first interconnection structures 14.

In some embodiments of the present disclosure, the bar-shaped interconnection is configured to electrically connect two or more electronic components. Each of the bar-shaped interconnection is electrically connected to plural of electrical terminals, and has reduced resistance due to its increased area. Thus, the bar-shaped interconnections help to improve electrical performance of the semiconductor device. In some embodiments of the present disclosure, the interconnection structures covers plural of electrical terminals, which helps to increase the alignment tolerance between the electronic components, and thus the reliability can be increased.

In one exemplary aspect, a semiconductor device includes a first electronic component, a second electronic component, a third electronic component, a plurality of first interconnection structures, and a plurality of second interconnection structures. The second electronic component is between the first electronic component and the third electronic component. The first interconnection structures are between and electrically connected to the first electronic component and the second electronic component. Each of the first interconnection structures has a length along a first direction substantially parallel to a surface of the first electronic component and a width along a second direction substantially parallel to the surface and substantially perpendicular to the first direction. The length is larger than the width. The second interconnection structures are between and electrically connected to the second electronic component and the third electronic component.

In another aspect, a semiconductor device includes a first electronic component, a second electronic component, a third electronic component, a plurality of bar-like first interconnection structures, and a plurality of second interconnection structures. The bar-like first interconnection structures are between and electrically connected to the first electronic component and the second electronic component. Each of the bar-like first interconnection structures has a length along a first direction substantially parallel to a surface of the first electronic component and a width along a second direction substantially parallel to the surface and substantially perpendicular to the first direction. The length is larger than the width. The second interconnection structures are between and electrically connected to the second electronic component and the third electronic component. A distance between the first electronic component and the second electronic component is substantially equal to a height of the first interconnect structure, and a distance between the second electronic component and the third electronic component is substantially equal to a height of the second interconnection structure.

In yet another aspect, a semiconductor device includes a first electronic component having a first surface and a second surface opposite to the first surface, a second electronic component having a first surface facing the first electronic component and a second surface opposite to the first surface, a third electronic component having a first surface facing the second electronic component and a second surface opposite to the first surface, a plurality of first interconnection structures, and a plurality of second interconnection structures. The first interconnection structures are between the first surface of the first electronic component and the first surface of the second electronic component. The first interconnection structures are electrically connected to the first electronic component and the second electronic component. Each of the first interconnection structures has a length along a first direction substantially parallel to the first surface of the first electronic component and a width along a second direction substantially parallel to the first surface of the first electronic component and substantially perpendicular to the first direction. The length is larger than the width. The second interconnection structures are between the first surface of the second electronic component and the first surface of the third electronic component. The second interconnection structures are electrically connected to the second electronic component and the third electronic component. A height of each of the second

What is claimed is:

1. A semiconductor device, comprising:
a first electronic component;
a second electronic component;
a third electronic component, wherein the second electronic component is between the first electronic component and the third electronic component;
a plurality of first interconnection structures between and electrically connected to the first electronic component and the second electronic component, wherein, the first interconnection structures are separated from each other, each of the first interconnection structures has a length along a first direction substantially parallel to a surface of the first electronic component and a width along a second direction substantially parallel to the surface and substantially perpendicular to the first direction, the length is larger than the width, the width of each first interconnection structure is consistent from a top view, and a height of each of the first interconnection structure is consistent; and
a plurality of second interconnection structures between and electrically connected to the second electronic component and the third electronic component.

2. The semiconductor device of claim 1, wherein a ratio of the length to the width of at least one of the first interconnection structures is greater than 2.

3. The semiconductor device of claim 1, wherein the first electronic component comprises a plurality of electrical terminals, and each of the first interconnection structures is electrically connected to more than one of the plurality of electrical terminals of the first electronic component.

4. The semiconductor device of claim 1, wherein the plurality of the first interconnection structures are arranged in the second direction, and each of the first interconnection structures are extended along the first direction.

5. The semiconductor device of claim 1, wherein the plurality of first interconnection structures comprises a first set of first interconnection structures and a second set of first interconnection structures, the first interconnection structures of the first set are electrically connected, the first interconnection structures of the second set are electrically connected, and the first interconnection structures of the first set and the second set are arranged alternately in the second direction and electrically disconnected from one another.

6. The semiconductor device of claim 1, wherein at least one of the first interconnection structures comprises a plurality of segmented interconnection structures.

7. The semiconductor device of claim 1, wherein each of the first electronic component, the second electronic component and the third electronic component individually comprises one of an integrated passive device, an active device, an interposer, a package structure, a package substrate or a printed circuit board.

8. A semiconductor device, comprising:
a first electronic component;
a second electronic component;
a third electronic component;
a plurality of bar-like first interconnection structures between and electrically connected to the first electronic component and the second electronic component, wherein each of the bar-like first interconnection structures has a length along a first direction substantially parallel to a surface of the first electronic component and a width along a second direction substantially parallel to the surface and substantially perpendicular to the first direction, the length is larger than the width from a top view, and a height of each of the bar-like first interconnection structure is consistent;
a plurality of second interconnection structures between and electrically connected to the second electronic component and the third electronic component;
an underfill layer between the second electronic component and the third electronic component, and at least laterally surrounding the plurality of second interconnection structures; and
an encapsulant surrounding the third electronic component and the underfill layer, wherein a top surface of the third electronic component is exposed through the encapsulant,
wherein a distance between the first electronic component and the second electronic component is substantially equal to the height of the first interconnection structure, and a distance between the second electronic component and the third electronic component is substantially equal to a height of the second interconnection structure,
wherein a portion of sidewall of the third electronic component is covered by the underfill1 layer.

9. The semiconductor device of claim 8, wherein a ratio of the length to the width of at least one of the first interconnection structures is greater than 2.

10. The semiconductor device of claim 8, wherein the first electronic component comprises a plurality of electrical terminals, and each of the bar-like first interconnection structures is electrically connected to more than one of the plurality of electrical terminals of the first electronic component.

11. The semiconductor device of claim 8, wherein the plurality of bar-like first interconnection structures comprises a first set of first interconnection structures and a second set of first interconnection structures, the first interconnection structures of the first set are electrically connected, the first interconnection structures of the second set are electrically connected, and the first interconnection structures of the first set and the second set are arranged alternately in the second direction and electrically disconnected from one another.

12. The semiconductor device of claim 8, wherein at least one of the bar-like first interconnection structures comprises a plurality of segmented interconnection structures.

13. The semiconductor device of claim 8, wherein the height of each of the second interconnection structures is larger than the height of each of the bar-like first interconnection structures.

14. The semiconductor device of claim 8, wherein the height of each of the second interconnection structures is less than the height of each of the bar-like first interconnection structures.

15. A semiconductor device, comprising:
a first electronic component;
a second electronic component;
a third electronic component, wherein the second electronic component is between the first electronic component and the third electronic component;
a plurality of first interconnection structures between and electrically connected to the first electronic component and the second electronic component, wherein the first interconnection structures are separated from each other, each of the first interconnection structures has a length along a first direction substantially parallel to a surface of the first electronic component, a width along a second direction substantially parallel to the surface and substantially perpendicular to the first direction, the length is larger than the width, the width of each first interconnection structure is consistent from a top view, and a height of each of the first interconnection structure is consistent; and
a plurality of second interconnection structures between and electrically connected to the second electronic component and the third electronic component,
wherein each of the first interconnection structures comprises a first conductive layer, a second conductive layer over the first conductive layer, and a third conductive layer over the second conductive layer, widths of the first conductive layer, second conductive layer and third conductive layer are substantially equal to the width of the first interconnect structure.

16. The semiconductor device of claim 15, wherein a ratio of the length to the width of at least one of the first interconnection structures is greater than 2.

17. The semiconductor device of claim 15, wherein the plurality of first interconnection structures comprises a first set of first interconnection structures and a second set of first interconnection structures, the first interconnection structures of the first set are electrically connected, the first interconnection structures of the second set are electrically connected, and the first interconnection structures of the first set and the second set are arranged alternately in the second direction and electrically disconnected from one another.

18. The semiconductor device of claim 15, wherein at least one of the first interconnection structures comprises a plurality of segmented interconnection structures.

19. The semiconductor device of claim 15, further comprising an underfill layer between the second electronic component and the third electronic component.

20. The semiconductor device of claim 15, further comprising an encapsulant encapsulating at least a portion of the third electronic component.

* * * * *